United States Patent
Hung et al.

(10) Patent No.: US 8,288,280 B2
(45) Date of Patent: Oct. 16, 2012

(54) CONDUCTOR REMOVAL PROCESS

(75) Inventors: Yung-Tai Hung, Hsinchu (TW);
Chin-Tsan Yeh, Hsinchu (TW);
Chin-Ta Su, Hsinchu (TW); Ling-Wu Yang, Hsinchu (TW); Tung-Han Chuang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 631 days.

(21) Appl. No.: 11/780,024

(22) Filed: Jul. 19, 2007

(65) Prior Publication Data
US 2009/0023289 A1      Jan. 22, 2009

(51) Int. Cl.
*H01L 21/302*   (2006.01)
*H01L 21/461*   (2006.01)

(52) U.S. Cl. ........ 438/689; 438/690; 438/691; 438/692; 438/693

(58) Field of Classification Search .................. None
See application file for complete search history.

(56) References Cited

U.S. PATENT DOCUMENTS

| | | | |
|---|---|---|---|
| 5,334,281 A | | 8/1994 | Doerre et al. |
| 5,926,717 A | * | 7/1999 | Michael et al. ............ 438/387 |
| 6,008,123 A | * | 12/1999 | Kook et al. ................ 438/639 |
| 6,191,003 B1 | * | 2/2001 | Lin et al. .................. 438/431 |
| 6,610,557 B2 | | 8/2003 | Lee et al. |
| 6,610,577 B1 | * | 8/2003 | Thomas et al. ............ 438/311 |
| 6,924,220 B1 | * | 8/2005 | Yang et al. ................ 438/593 |
| 2007/0281486 A1 | * | 12/2007 | Han et al. .................. 438/692 |

* cited by examiner

*Primary Examiner* — Duy Deo
(74) *Attorney, Agent, or Firm* — J.C. Patents

(57) ABSTRACT

A conductor removal process is described, which is applied to a substrate that has thereon a plurality of patterns and a blanket conductor layer covering the patterns. An upper portion of the blanket conductor layer entirely over the patterns is oxidized to form a dielectric layer. A CMP step is performed to remove the dielectric layer and a portion of the remaining conductor layer in turn and thereby expose the patterns.

10 Claims, 1 Drawing Sheet

CONDUCTOR REMOVAL PROCESS

BACKGROUND OF THE INVENTION

1. Field of the Invention

This invention relates to a semiconductor process, and more particularly relates to a conductor removal process that is applied to a substrate having thereon a plurality of patterns and a blanket conductor layer covering the patterns and to a silicon removal process derived from the conductor removal process.

2. Description of the Related Art

In current integrated circuit (IC) process, chemical mechanical polishing (CMP) is the major technique to make global planarization. Almost any material formed on a wafer, such as polysilicon, silicon oxide or a metal, can be polished with a suitable polishing slurry. For example, polysilicon is conventionally polished with a polishing slurry based on a silica ($SiO_2$) abrasive.

However, because native oxide is easily formed on poly-Si, a silica/ceria slurry is needed to polish native oxide before the silica slurry is used so that the polysilicon CMP process is complicated. Moreover, as the polysilicon is formed covering patterns of silicon oxide and has to be removed partially to expose the patterns, poly-Si recess or oxide loss easily occur during the over-polishing stage due to the lower oxide/poly-Si selectivity of silica slurry.

For example, FIG. 1 illustrates the result of a poly-Si CMP process using a silica/ceria slurry and a silica slurry on a polysilicon layer in a self-aligned gate fabricating process as described in U.S. Pat. Nos. 6,610,577 and 6,924,220.

Referring to FIG. 1, the substrate 100 includes a memory array area 102 and a peripheral area 104. Isolation patterns 110 of silicon oxide has been formed in the substrate 100 protrudent over the same, a gate dielectric layer 120 formed on the substrate 100 between the isolation patterns 110 and a polysilicon layer 130 formed on the substrate 100 covering the isolation patterns 110. After the native oxide is polished away with a silica/ceria slurry, a silica slurry is used to polish away a portion of the polysilicon layer 130 and thus expose the isolation patterns 110. The remaining polysilicon layer 130 includes gates 130a of MOS devices (not shown) in the memory array area 102 and gates 130b of those (not shown) in the peripheral area 104, as indicated by the dash lines in the figure.

However, since the oxide/polysilicon polishing selectivity of silica slurry is poor, recess easily occurs to the wider gates 130b in the peripheral area 104 during the over-polishing, as indicated by the curved dash line, so that the resistance of the gates 130b is not easy to control. Though forming protective oxide over portions of the polysilicon layer 130 to be polished to form the gates 130b can prevent recesses on the gates 130b, the process of forming and defining the protective oxide is quite time-consuming.

SUMMARY OF THE INVENTION

Accordingly, this invention provides a conductor removal process that is applied to a substrate having thereon a plurality of patterns and a blanket conductor layer covering the patterns, and also provides a silicon removal process derived therefrom.

In the conductor removal process of this invention, an upper portion of the blanket conductor layer entirely over the patterns is oxidized to form a dielectric layer. A CMP step is then performed to remove the dielectric layer and a portion of the remaining conductor layer in turn and thereby expose the patterns.

In some cases, respective polishing rates of the dielectric layer and the material of the patterns are higher than that of the remaining conductor layer in the CMP step.

In an embodiment of the invention, the patterns include silicon oxide, the blanket conductor layer includes polysilicon, the dielectric layer includes silicon oxide, and the CMP step uses a ceria polishing slurry. It is particularly noted that in this application, a ceria slurry means a slurry containing ceria as only one kind of abrasive.

In the above embodiment, since an upper portion of the silicon layer is oxidized to form a silicon oxide layer and a ceria slurry provides a higher removal rate to silicon oxide than to silicon, the removal rate of the silicon layer is increased. Moreover, since the ceria slurry has excellent oxide/silicon selectivity in the CMP, a self-stop effect is caused as the patterns of silicon oxide are exposed. Consequently, silicon recess and oxide loss both are prevented with this invention and better silicon and oxide uniformity is caused as compared with a conventional silicon CMP process, without formation of protective oxide over the portions of the silicon layer prone to recesses.

It is to be understood that both the foregoing general description and the following detailed description are exemplary, and are intended to provide further explanation of the invention as claimed.

DESCRIPTION OF THE PREFERRED EMBODIMENTS

The following embodiment is intended to further explain this invention but not to limit the scope thereof. Though a self-aligned gate fabrication process is taken as an example in this embodiment, this invention is also applicable to other processes where a portion of a blanket conductor layer has to be removed to expose some patterns covered by the blanket conductor layer.

Moreover, though the aforementioned patterns, blanket conductor layer and dielectric layer respectively include device isolation patterns of silicon oxide, a blanket polysilicon layer and a silicon oxide layer in this embodiment, other suitable combinations of layers are also possible for them. For example, the patterns may be patterns of an inter-layer dielectric (ILD) layer but not device isolation patterns. It is also possible that the conductor layer includes a non-polysilicon material whose oxide is easier to polish than itself is, and/or the combination of the materials of the conductor layer and the patterns is one other than the combination of "polysilicon and silicon oxide" that also makes a good polishing selectivity between the material of the patterns and that of the conductor layer.

Further, though a ceria slurry is used in this embodiment, the polishing slurry applicable to this invention is not limited to ceria slurry. For example, the polishing slurry may be a non-ceria one that makes higher polishing rates to the above dielectric layer and the material of the above patterns than to the remaining conductor layer.

Figure 2:
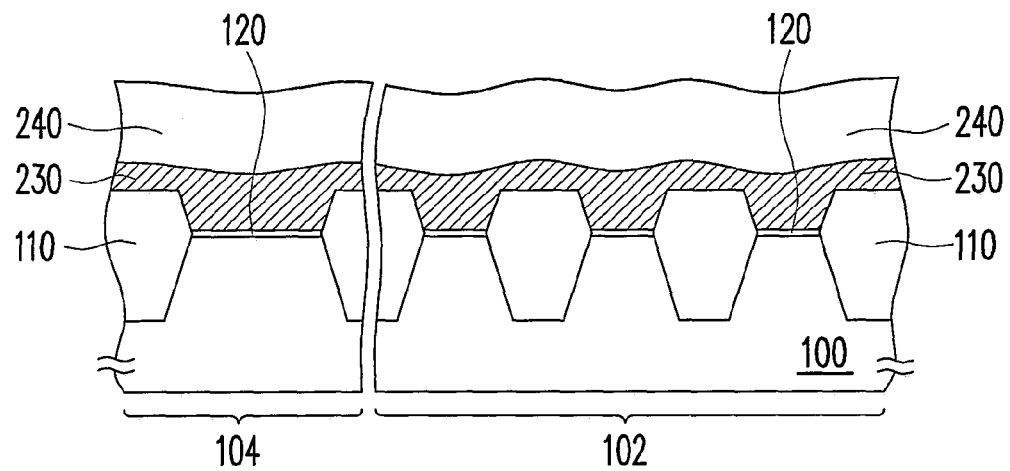
FIGS. 2 and 3 illustrate, in a cross-sectional view, a process flow of a self-stop conductor removal process according to an embodiment of this invention.
Figure 3:
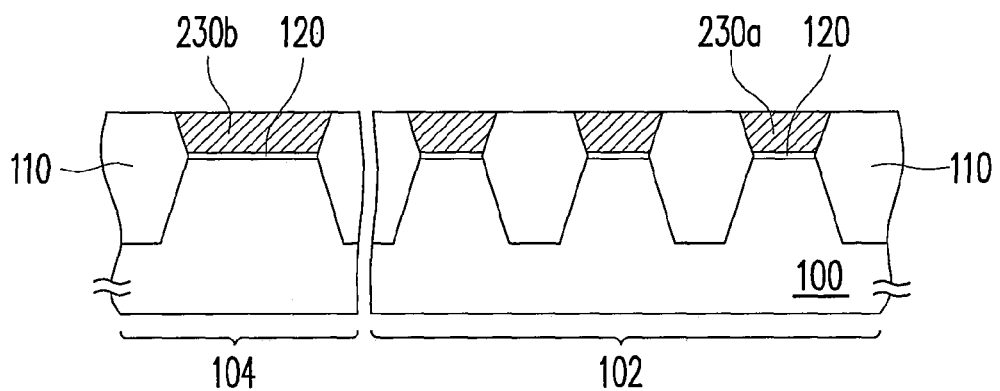

FIGS. 2 and 3 illustrate, in a cross-sectional view, a process flow of a self-stop conductor removal process according to the embodiment of this invention.

Figure 1:
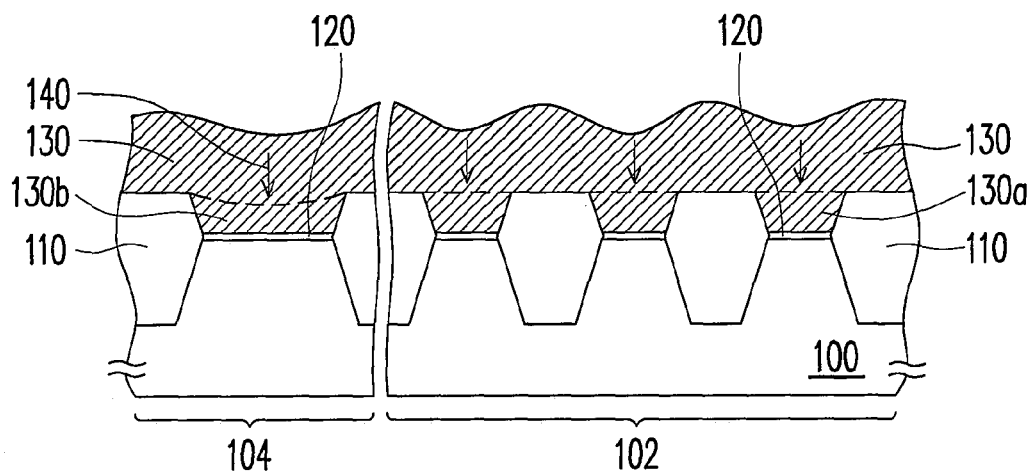
FIG. 1 illustrates the result of a conventional conductor removal process done to a polysilicon layer in a self-aligned gate fabrication process.

Referring to FIG. 2, the substrate 100 includes a memory array area 102 and a peripheral area 104. Isolation patterns 110 of silicon oxide have been formed in the substrate 100 protrudent over the same, a gate dielectric layer 120 formed on the same between the isolation patterns 110 and a polysilicon layer 230 formed over the same covering the isolation patterns 110. The polysilicon layer 230 has the same cross-sectional shape of the layer 130 in FIG. 1 before the layer 240 is formed.

The inter-pattern distance of the isolation patterns 110 in the peripheral area 104 is usually larger than that of the isolation patterns 110 in the memory array area 102. Moreover, when the polysilicon layer 230 in the memory array area 102 is for forming a plurality of floating gates between the isolation patterns 110, the gate dielectric layer 120 in the memory array area 102 is a tunnel layer, such as a thin oxide layer. When the polysilicon layer 230 in the memory array area 102 is for forming a plurality of control gates of trapping-type cells between the isolation patterns 110, the gate dielectric layer 120 in the memory array area 102 is a charge-rapping layer like a silicon oxide/silicon nitride/silicon oxide (ONO) composite layer. The gate dielectric layer 120 in the area 104 may be a thicker oxide layer.

Referring to FIG. 2 again, in the self-stop polysilicon removal process of this embodiment, an upper portion of the polysilicon layer 230 entirely over the isolation structure 110 is oxidized to form a silicon oxide layer 240, possibly through an in-situ steam generation (ISSG) oxidation process in which $O_2$ and $H_2$ are introduced into the chamber at a high temperature to produce water vapor for oxidation, or through dry oxidation or wet oxidation. The ISSG oxidation process is usually conducted at a temperature of about 850-1050° C. under a pressure of about 8-12 Torr, with an $H_2/O_2$ ratio of 0.1-0.5 (preferably 0.33). The oxidation is preferably conducted such that the thickness of the remaining polysilicon layer 230 between the silicon oxide layer 240 and the isolation structure 110 approximately ranges from 0 to 1500 angstroms.

Referring to FIG. 3, a CMP step is conducted using a ceria slurry to remove the silicon oxide layer 240 and a portion of the remaining polysilicon layer 230 higher than the top of the isolation structure 110, so as to form self-aligned gates 230a of the MOS transistors (not shown) in the memory array area 102 and self-aligned gates 230b of the MOS transistors (not shown) in the peripheral area 104. The polishing slurry may also include a surfactant except a ceria abrasive and water. The $SiO_2$/poly-Si selectivity in the CMP step can be (much) higher than 50, because the removal rate of ISSG oxide is about 2000-6000 angstroms/min and that of polysilicon is lower than 50 angstroms/min when a ceria slurry is used.

In the above embodiment of this invention, since an upper portion of the polysilicon layer 230 is oxidized to form a silicon oxide layer 240 and a ceria slurry provides a higher removal rate to silicon oxide than to polysilicon, the removal rate of the polysilicon layer 230 is increased. Moreover, since a ceria slurry has excellent oxide/polysilicon polishing selectivity, a self-stop effect is caused as the isolation structure 110 of silicon oxide is exposed so that recess of the wider gates 230b is prevented without formation of protective oxide over of the portions of the polysilicon layer 230 to be polished to form the gates 230b.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A conductor removal process, applied to a substrate that has thereon a plurality of patterns and a blanket conductor layer covering the patterns, and comprising:

oxidizing an upper portion of the blanket conductor layer entirely over the patterns to form a dielectric layer, wherein the oxidation is performed directly after the blanket conductive layer is formed so that an entire top surface of the upper portion of the blanket conductor layer is not covered at beginning of the oxidation, and the remaining conductor layer is not oxidized in the oxidation;

performing, after the oxidation is finished, a CMP step to remove the dielectric layer and a portion of the remaining conductor layer in turn and thereby expose the patterns;

wherein the blanket conductor layer is polysilicon and the dielectric layer is SiO2;

wherein a SiO2/polysilicon selectivity in the CMP step is higher than 50.

2. The conductor removal process of claim 1, wherein in the CMP step, respective polishing rates of the dielectric layer and a material of the patterns are higher than a polishing rate of the remaining conductor layer.

3. The conductor removal process of claim 1, wherein the upper portion of the conductor layer is oxidized through in-situ steam generation (ISSG) oxidation, dry oxidation or wet oxidation.

4. The conductor removal process of claim 1, wherein the patterns comprise a plurality of device isolation patterns protrudent over the substrate.

5. The conductor removal process of claim 4, wherein
the substrate has thereon a gate dielectric layer between the device isolation patterns and under the blanket conductor layer, and
the conductor layer remaining after the CMP step includes a plurality of self-aligned gates of a plurality of MOS devices between the device isolation patterns.

6. The conductor removal process of claim 5, wherein the device isolation11 patterns and the self-aligned gates are distributed in a memory array area and a peripheral area.

7. The conductor removal process of claim 6, wherein the self-aligned gates in the memory array area comprise a plurality of floating gates, and the gate dielectric layer comprises a tunnel layer.

8. The conductor removal process of claim 6, wherein the self-aligned gates in the memory array area comprise a plurality of control gates, and the gate dielectric layer comprises a charge-trapping layer.

9. The conductor removal process of claim 1, wherein the patterns comprise silicon oxide.

10. The conductor removal process of claim 1, wherein the blanket conductor layer comprises a blanket polysilicon layer and the dielectric layer comprises a silicon oxide layer.

* * * * *